United States Patent
Endo et al.

(10) Patent No.: US 10,220,636 B2
(45) Date of Patent: Mar. 5, 2019

(54) DRIVE APPARATUS THAT DRIVES LIGHT EMITTING DEVICE

(71) Applicant: CANON KABUSHIKI KAISHA, Tokyo (JP)

(72) Inventors: Wataru Endo, Tokyo (JP); Hirotaka Shiomichi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/598,828

(22) Filed: May 18, 2017

(65) Prior Publication Data

US 2017/0341413 A1 Nov. 30, 2017

(30) Foreign Application Priority Data

May 25, 2016 (JP) ................. 2016-104553

(51) Int. Cl.
| | | |
|---|---|---|
| *H05B 37/02* | (2006.01) | |
| *B41J 2/47* | (2006.01) | |
| *H01S 5/062* | (2006.01) | |
| *H01S 5/068* | (2006.01) | |
| *H01S 5/0683* | (2006.01) | |
| *H01S 5/042* | (2006.01) | |
| *B41J 2/447* | (2006.01) | |

(52) U.S. Cl.
CPC ............. *B41J 2/47* (2013.01); *B41J 2/447* (2013.01); *H01S 5/042* (2013.01); *H01S 5/0683* (2013.01); *H01S 5/06209* (2013.01); *H01S 5/06233* (2013.01); *H01S 5/06808* (2013.01); *H01S 5/06812* (2013.01); *H05B 37/0227* (2013.01); *H05B 37/0272* (2013.01)

(58) Field of Classification Search
CPC .. H01S 5/042; H01S 5/06209; H01S 5/06233; H01S 5/06808; H01S 5/06812; H01S 5/0683; H05B 37/0227; H05B 37/0272
USPC .............................. 372/31, 38; 347/237, 247
See application file for complete search history.

(56) References Cited

U.S. PATENT DOCUMENTS

| | | | | |
|---|---|---|---|---|
| 4,967,417 A | * | 10/1990 | Yamada | H01S 5/06832 372/29.015 |
| 5,151,910 A | * | 9/1992 | Inuyama | H04N 1/40037 372/29.01 |

(Continued)

FOREIGN PATENT DOCUMENTS

| | | |
|---|---|---|
| JP | 10-150236 A | 6/1998 |
| JP | 11-26850 A | 1/1999 |

(Continued)

*Primary Examiner* — Tung X Le
(74) *Attorney, Agent, or Firm* — Venable LLP

(57) ABSTRACT

A drive apparatus includes a light emitting device, a light receiving device configured to receive light emitted by the light emitting device, a comparison circuit configured to compare a light quantity of light detected by the light receiving device with a target value indicating a light quantity of light to be emitted by the light emitting device and generate a control signal corresponding to a comparison result, and a drive circuit configured to supply a drive signal corresponding to the control signal to the light emitting device. The drive circuit includes a gain changing switch configured to change, in accordance with the target value, a gain of the drive circuit.

16 Claims, 13 Drawing Sheets

(56) References Cited

U.S. PATENT DOCUMENTS

| | | | | |
|---|---|---|---|---|
| 5,473,153 A * | 12/1995 | Araki | ................ | G06K 15/1209 |
| | | | | 250/205 |
| 5,912,694 A * | 6/1999 | Miyake | ................ | B41J 2/471 |
| | | | | 347/129 |
| 6,466,594 B1 * | 10/2002 | Iwazaki | ................ | G06K 15/1214 |
| | | | | 347/246 |
| 6,566,641 B1 * | 5/2003 | Suda | ................ | G01J 1/32 |
| | | | | 250/205 |
| 6,728,495 B1 * | 4/2004 | Miki | ................ | H04B 10/504 |
| | | | | 398/197 |
| 7,239,336 B2 * | 7/2007 | Kuchii | ................ | G03B 27/72 |
| | | | | 347/236 |
| 9,465,312 B2 * | 10/2016 | Iida | ................ | G03G 15/0275 |
| 2001/0026566 A1 * | 10/2001 | Taguchi | ................ | H01S 5/0683 |
| | | | | 372/38.02 |
| 2008/0212628 A1 * | 9/2008 | Tanaka | ................ | H01S 5/06832 |
| | | | | 372/38.02 |
| 2012/0155237 A1 * | 6/2012 | Takahashi | ................ | G11B 7/1263 |
| | | | | 369/53.26 |

FOREIGN PATENT DOCUMENTS

| | | |
|---|---|---|
| JP | 2004-165444 A | 6/2004 |
| JP | 2005-183657 A | 7/2005 |

* cited by examiner

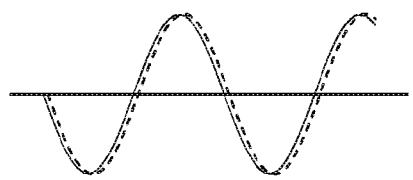
FIG. 6A  WITH GAIN CHANGE: WHEN LARGE LIGHT QUANTITY IS SET
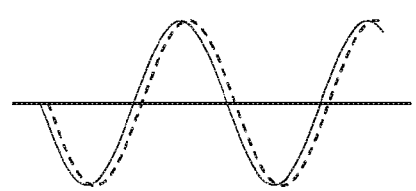
FIG. 6B  WITH GAIN CHANGE: WHEN SMALL LIGHT QUANTITY IS SET
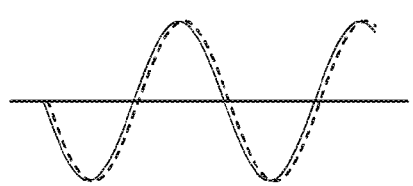
FIG. 6C  WITHOUT GAIN CHANGE: WHEN LARGE LIGHT QUANTITY IS SET
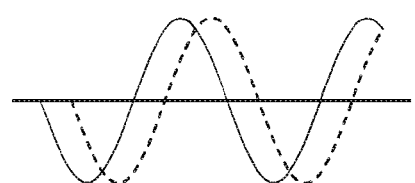
FIG. 6D  WITHOUT GAIN CHANGE: WHEN SMALL LIGHT QUANTITY IS SET

DRIVE APPARATUS THAT DRIVES LIGHT EMITTING DEVICE

BACKGROUND OF THE INVENTION

Field of the Invention

The present invention relates to a drive apparatus that drives a light emitting device.

Description of the Related Art

A drive apparatus that drives a light emitting device such as a semiconductor laser is used in a printer or the like. Japanese Patent Laid-Open No. 2004-165444 discloses a semiconductor laser drive apparatus which has an APC (Automatic Power Control) function to obtain a predetermined light output. The semiconductor laser drive apparatus disclosed in Japanese Patent Laid-Open No. 2004-165444 includes a photodiode, an operational amplifier, an analog switch, a hold capacitor, a voltage-current converting circuit, a switch circuit, a variable resistance, and a reference potential generating circuit. The photodiode makes a current, which is proportional to the emitted light quantity of a laser diode, to flow to the variable resistance. This current is converted into a voltage by the variable resistance and supplied to the inverting input terminal of the operational amplifier. A reference potential is supplied from the reference potential generating circuit to the non-inverting input terminal of the operational amplifier. The output terminal of the operational amplifier is connected to one terminal of the analog switch, and the other terminal of the analog switch is connected to the voltage-current converting circuit. A hold capacitor is connected between the other terminal of the analog switch and a ground potential. The voltage-current converting circuit converts the input voltage into a drive current of the laser diode. The switch circuit performs switching in accordance with a DATA signal. The semiconductor laser drive apparatus performs, by the above-described arrangement, feedback control on the current to be supplied to the laser diode so that the voltage detected using the photodiode is equal to the reference potential.

When increasing a light quantity control range, a feedback loop operation for implementing an APC function can become unstable in a region where the response characteristics of the components of the feedback loop are bad. For example, the light quantity of light to be emitted by a light emitting device can have, in a specific region, a low response characteristic in a component such as a voltage-current converting circuit, and the delay of the feedback loop could increase. If this delay becomes too large, oscillation occurs.

SUMMARY OF THE INVENTION

The present invention provides a technique advantageous in improving the stability of a drive apparatus for driving a light emitting device.

One of aspects of the present invention provides a drive apparatus comprising: a light emitting device; a light receiving device configured to receive light emitted by the light emitting device; a comparison circuit configured to compare a light quantity of light detected by the light receiving device with a target value indicating a light quantity of light to be emitted by the light emitting device and generate a control signal corresponding to a comparison result; and a drive circuit configured to supply a drive signal corresponding to the control signal to the light emitting device, wherein the drive circuit includes a gain changing switch configured to change, in accordance with the target value, a gain of the drive circuit, the gain of the drive circuit being defined such that the control signal is an input to the driving circuit and the drive signal is an output from the driving circuit.

Further features of the present invention will become apparent from the following description of exemplary embodiments with reference to the attached drawings.

BRIEF DESCRIPTION OF THE DRAWINGS

FIGS. 6A to 6D are views each exemplifying input/output characteristics of the voltage-current converting circuit;

DESCRIPTION OF THE EMBODIMENTS

Exemplary embodiments of the present invention will be described below with reference to the accompanying drawings.

Figure 1:
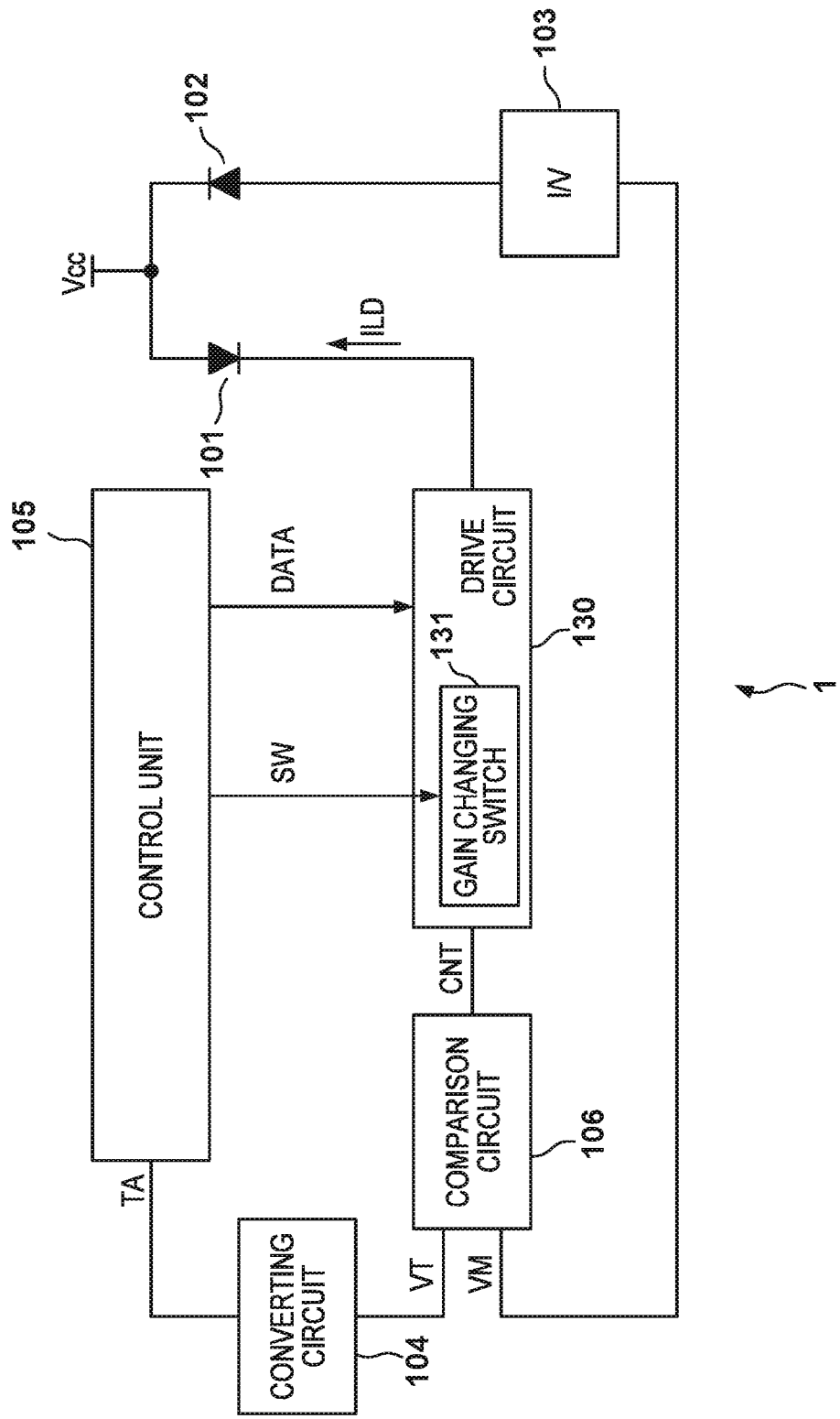
FIG. 1 is a block diagram showing the arrangement of a drive apparatus according to the first embodiment of the present invention.

FIG. 1 shows the arrangement of a drive apparatus 1 according to the first embodiment of the present invention. The drive apparatus 1 can include a light emitting device 101, a light receiving device 102, a comparison circuit 106, and a drive circuit 130. The comparison circuit 106, the drive circuit 130, the light emitting device 101, the light receiving device 102, and a current-voltage converting circuit 103 form a feedback loop. The feedback loop provides an APC (Automatic Power Control) function that adjusts a light quantity automatically. The feedback loop can also be called an APC loop. More specifically, the feedback loop can drive the light emitting device 101 so that the light quantity of light emitted by the light emitting device 101 matches a target value (target light quantity). The light emitting device 101 can be, for example, a light emitting diode (LED) or a laser diode. The drive apparatus 1 can be incorporated into a printer such as a laser beam printer or an LED printer. The light receiving device 102 can be, for example, a photoelectric conversion device such as a photodiode. The anode terminal of the light emitting device 101 and the cathode terminal of the light receiving device 102 can be connected to a power source Vcc.

The comparison circuit 106 compares a target value indicating the intensity of light to be emitted by the light emitting device 101 and a light quantity of light detected by the light receiving device 102 and generates a control signal CNT corresponding to the obtained comparison result. In an example, the comparison circuit 106 compares a target voltage VT as a target value indicating the light quantity of light to be emitted by the light emitting device 101 and a monitor voltage VM indicating the light quantity of light detected by the light receiving device 102 to generate the control signal CNT in accordance with the comparison result. The control signal CNT can be, for example, a signal that requests an increase of the drive current of the light emitting device 101 when the monitor voltage VM is lower than the target voltage VT and requests a decrease of the drive current of the light emitting device 101 when the monitor voltage VM is higher than the target voltage VT.

In the example shown in FIG. 1, the drive apparatus 1 includes a converting circuit 104 that converts a first target value TA defined by a first scale into the target voltage VT which serves as a second target value defined by a second scale, and the target voltage VT is supplied to the comparison circuit 106. The first target value TA suffices to be a value that indicates the light quantity of light to be emitted by the light emitting device 101, and the scale indicating this may be a non-dimensional number or may be a physical quantity such as a light beam, a light intensity, or luminance. In the example shown in FIG. 1, a current corresponding to the light quantity of light received from the light emitting device 101 is generated by the light receiving device 102, and the monitor voltage VM is generated when this current is converted into a voltage by the current-voltage converting circuit 103.

The drive circuit 130 supplies, to the light emitting device 101, a drive current ILD as a drive signal corresponding to the control signal CNT supplied from the comparison circuit 106. Here, the drive current ILD can be understood as a signal obtained by multiplying the control signal CNT by the gain of the drive circuit 130 which receives the control signal CNT as an input and transmits the drive current ILD as an output. The drive circuit 130 includes a gain changing switch 131 for changing the gain of the drive circuit 130 in accordance with the target value TA. The gain of the drive circuit 130 can be defined as a ratio (ILD/CNT) of the drive current ILD output from the drive circuit 130 and the control signal CNT input to the drive circuit 130. For example, letting ILD(s) be a Laplace transform of the drive current ILD and CNT(s) be a Laplace transform of the control signal CNT, a gain G(s) of the drive circuit 130 can be provided by ILD(s)/CNT(s). Alternatively, letting ILD(t) be a function of time t of the drive current and CNT(t) be the function of time t of the control signal, a gain G(t) of the drive circuit 130 can be provided by ILD(t)/CNT(t). The gain changing switch 131 can be understood as a switch for changing the circuit arrangement of the drive circuit 130 in accordance with the target value TA.

An arrangement in which the gain of the drive circuit 130 is changed by the gain changing switch 131 in accordance with the target value TA is advantageous in improving the stability of the feedback loop of the drive apparatus 1.

The drive apparatus 1 can include a control unit 105 that generates the target value TA and a gain control signal SW to control the gain changing switch 131 so that the gain of the drive circuit 130 is changed in accordance with the target value TA. The control unit 105 can be formed to supply, to the drive circuit 130, control data DATA for controlling the supply and non-supply (that is, ON and OFF) of the current ILD to the light emitting device 101. The control data DATA can be data that has undergone pulse width modulation. The drive circuit 130 can be formed to control the supply and non-supply of the current ILD to the light emitting device 101 in accordance with the control data DATA. For example, the drive circuit 130 can be formed to supply the drive current ILD to the light emitting device 101 when the control data DATA has a first value and not to supply the current ILD to the light emitting device 101 when the control data DATA has a second value.

Figure 2:
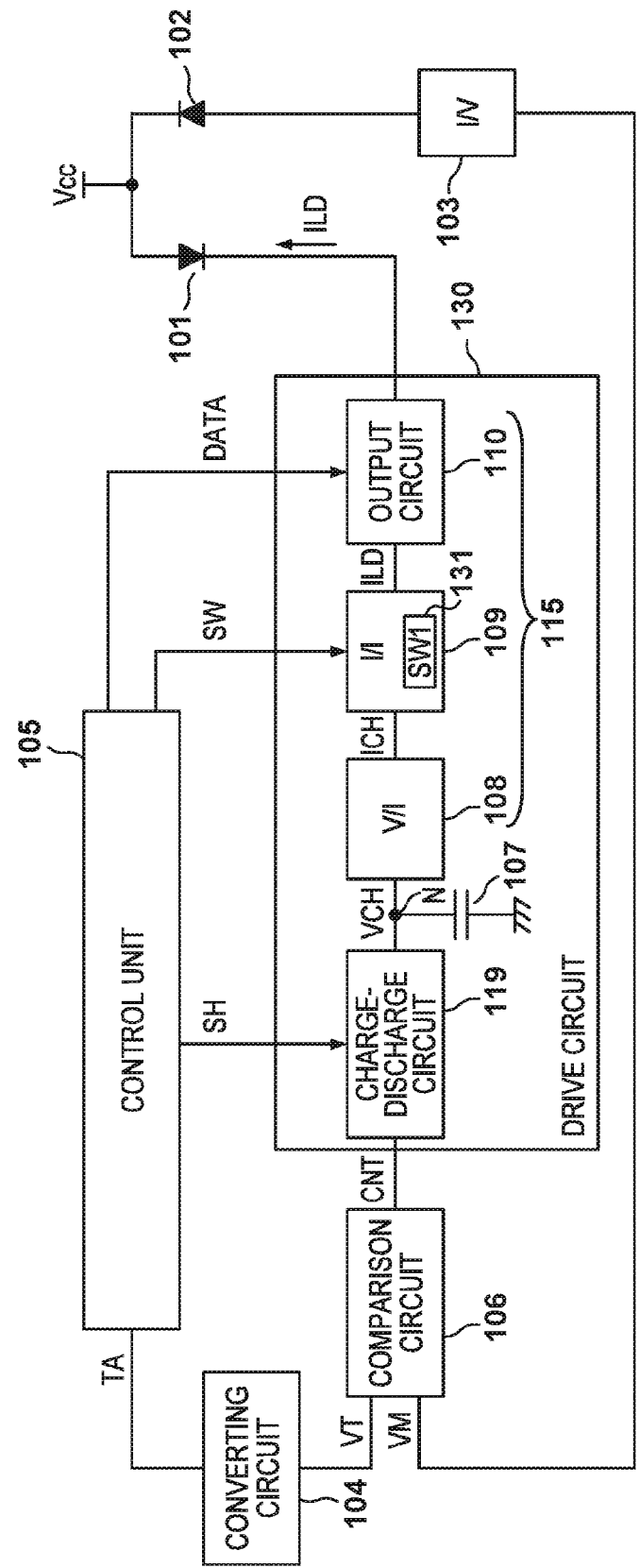
FIG. 2 is a block diagram showing the arrangement of a drive apparatus according to the second embodiment of the present invention.

The second to fifth embodiments that are detailed examples of the first embodiment will be described hereinafter. FIG. 2 shows the arrangement of a drive apparatus 1 according to the second embodiment of the present invention. Matters not mentioned in the second embodiment can comply with the first embodiment. In the second embodiment, a drive circuit 130 includes a charge-discharge circuit 119 that performs, in accordance with a control signal CNT, charging/discharging of a node connected to a capacitance (capacitor) 107, and a current supply circuit 115 that supplies a current ILD corresponding to a voltage VCH of the node N to a light emitting device 101. The capacitance 107 can be arranged between the node N and a reference potential (for example, a ground potential). The charge-discharge circuit 119 performs charging/discharging of the capacitance 107 based on the control signal CNT supplied from a comparison circuit 106. The charge-discharge circuit 119 can be formed to have a sample and hold function. In this case, the charge-discharge circuit 119 performs charging/discharging of the capacitance 107 in a sample mode and does not perform charging/discharging of the capacitance 107 in a hold mode. The charge-discharge circuit holds the voltage VCH of the capacitance 107 which is set immediately before switching from the sample mode to the hold mode.

Figure 14:
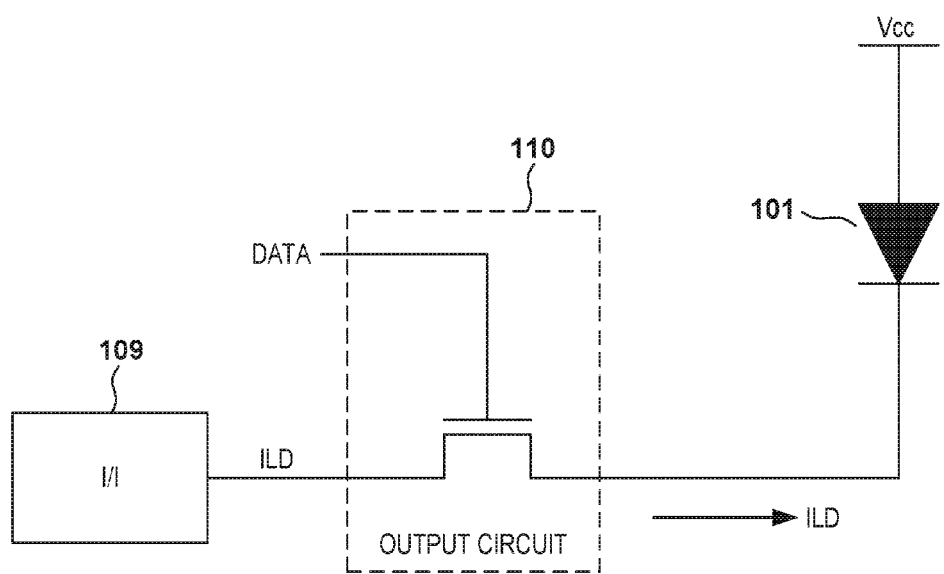
FIG. 14 is a circuit diagram showing an example of the arrangement of an output circuit.

The current supply circuit 115 can include a voltage-current converting circuit 108, a current-current converting circuit 109, and an output circuit 110. The voltage-current converting circuit 108 converts the voltage VCH of the node N to a current ICH. The current-current converting circuit 109 amplifies the current ICH and outputs the current ILD corresponding to the current ICH. The output circuit 110 has, for example, an arrangement exemplified in FIG. 14 and controls the supply/non-supply of the current ILD to the light emitting device 101 in accordance with control data DATA. The output circuit 110 can include, as exemplified in FIG. 14, a transistor to whose gate the control data DATA is supplied and whose source and drain are connected so as to form a current path between the current-current converting circuit 109 and the light emitting device 101. A gain changing switch 131 can include a switch SW1 for changing the gain (more specifically, the gain of the current-current converting circuit 109) of the current supply circuit 115 so that the gain of the drive circuit 130 is changed in accordance with a target value TA. A description of the arrangement of the current-current converting circuit 109 which includes the switch SW1 will be given later. The gain (more specifically the gain of the current-current converting circuit 109) of the current supply circuit 115 when the target value TA is smaller than the reference value can be set to be smaller than the gain (more specifically, the gain of the current-current converting circuit 109) of the current supply circuit 115 when the target value TA is larger than the reference value.

A control unit 105 can be formed to control the state (the state of a gain control signal SW) of the gain changing switch 131 (the switch SW1) in accordance with the target value TA in a state in which the value of the control data DATA is maintained to be constant so that the current ILD is supplied continuously from the drive circuit 130 to the light emitting device 101. That is, the control unit 105 can be formed to control the state (the state of the gain control signal SW) of the gain changing switch 131 (the switch SW1) in accordance with the target value TA without changing the state of the output circuit 110.

Figure 3:
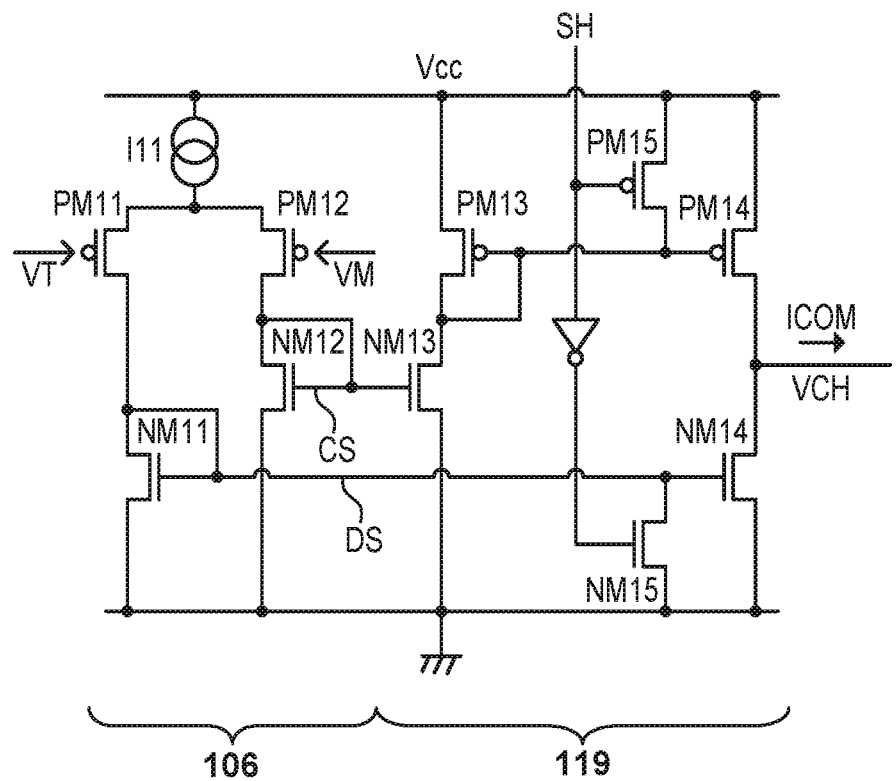
FIG. 3 is a circuit diagram showing an example of the arrangement of a comparison circuit and a charge-discharge circuit of the drive apparatus according to the second embodiment of the present invention.

FIG. 3 shows a more specific example of the arrangement of the comparison circuit 106 and the charge-discharge circuit 119. The comparison circuit 106 can include a current source Il1, PMOS transistors PM11 and PM12, and NMOS transistors NM11 and NM12. The charge-discharge circuit 119 can include PMOS transistors PM13, PM14, and PM15, and NMOS transistors NM13, NM14, and NM15.

One terminal of the current source Il1 is connected to a power source Vcc, and the other terminal of the current source Il1 is connected to the sources of PMOS transistors PM11 and PM12. A target voltage (target value) VT is supplied to the gate of the PMOS transistor PM11, and a monitor voltage VM is supplied to the gate of the PMOS transistor PM12. The drain of the PMOS transistor PM11 is connected to the gate and drain of the NMOS transistor NM11. The drain of the PMOS transistor PM12 is connected to the gates of the NMOS transistors NM12 and NM13 and the drain of the NMOS transistor NM12. The gate and drain of the NMOS transistor NM11 are connected to the gate of the NMOS transistor NM14 and the drain of the NMOS transistor NM15. The drain of the NMOS transistor NM13 is connected to the gates of the PMOS transistors PM13 and PM 14 and to the drains of the PMOS transistors PM13 and PM15. The drain of the PMOS transistor PM14 is connected to the drain of the NMOS transistor NM14 and outputs a current ICOM to the capacitance 107. In addition, a sample and hold signal SH is supplied to the gate of the PMOS transistor PM15, and an inverted signal of the sample and hold signal SH is supplied to the gate of the NMOS transistor NM15.

In the example shown in FIG. 3, a signal DS which appears in the gate and the drain of the NMOS transistor NM11 and a signal CS which appears in the gate and the drain of the NMOS transistor NM12 are examples of the aforementioned control signal CNT.

The current ICOM that flows to the capacitance 107 is a current that has a value obtained by subtracting a value of a current output by the NMOS transistor NM14 from a value of a current output by the PMOS transistor PM14. If the monitor voltage VM is lower than the target voltage VT, the current of the current source Il1 flows predominantly to the PMOS transistor PM12, and the mirror current flows from the PMOS transistor PM14 to the capacitance 107. As a result, a charging operation to the capacitance 107 is performed so as to increase the voltage VCH of the node N. On the other hand, if the monitor voltage VM is higher than the target voltage VT, the current from the current source Il1 flows predominantly to the PMOS transistor PM11, and the mirror current flows from the capacitance 107 to the NMOS transistor NM14. As a result, a discharging operation from the capacitance 107 is performed so as to decrease the voltage VCH of the node N.

In addition, when the level of the sample and hold signal SH is "H" (sample mode), the above-described charging/discharging operations are performed since the PMOS transistor PM15 and the NMOS transistor NM15 are turned off. On the other hand, when the level of the sample and hold signal SH is "L" (hold mode), the PMOS transistor PM15 and the NMOS transistor NM15 are turned on. As a result, the PMOS transistor PM14 and the NMOS transistor NM14 are turned off, and the voltage VCH of the capacitance 107 is held to a voltage value set immediately before the level of the sample and hold signal changes from "H" to "L".

Figure 4:
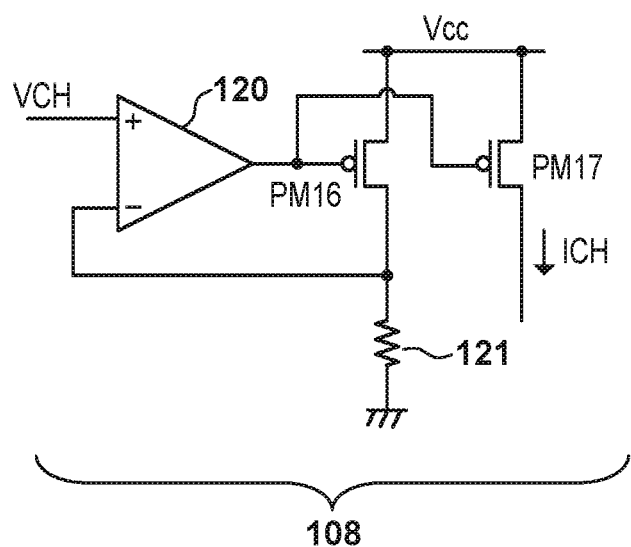
FIG. 4 is a circuit diagram showing an example of the arrangement of a voltage-current converting circuit.

FIG. 4 shows an example of the detailed arrangement of the voltage-current converting circuit 108. The voltage-current converting circuit 108 can be formed by an operational amplifier 120, PMOS transistors PM16 and PM17, and a resistance 121. The voltage VCH is supplied to the positive input terminal of the operational amplifier 120, and the negative input terminal of the operational amplifier is connected to the drain of the PMOS transistor PM16 and one terminal of the resistance 121. The output of the operational amplifier 120 is connected to the gates of the PMOS transistors PM16 and PM17. The other terminal of the resistance 121 is connected to a ground potential, and the sources of the PMOS transistors PM16 and PM17 are connected to the power source Vcc. As the positive input terminal and the negative input terminal of the operational amplifier 120 are virtually short-circuited, the voltage VCH is applied to the resistance 121 and converted into a current, and a current ICH which is the mirror current is output from the PMOS transistor PM17 to the current-current converting circuit 109.

Figure 5:
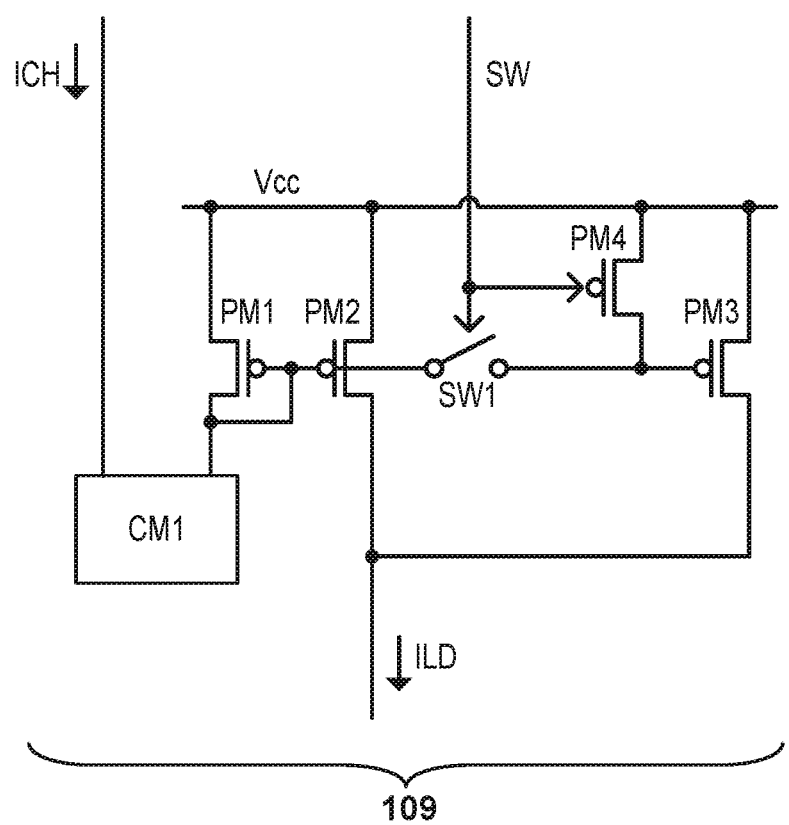
FIG. 5 is a circuit diagram showing an example of the arrangement of a current-current converting circuit.
Figure 7A:
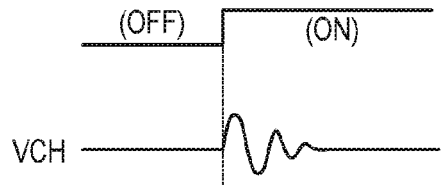
FIGS. 7A to 7D are views each exemplifying a waveform of a voltage VCH in the drive apparatus according to the second embodiment of the present invention.
Figure 7B:
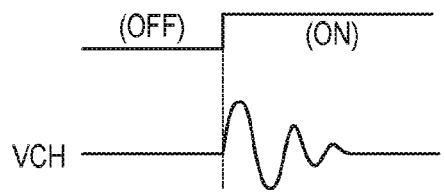
Figure 7C:
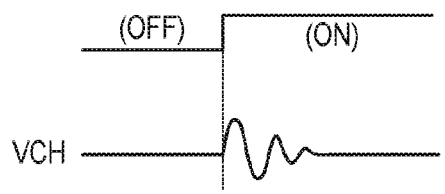
Figure 7D:
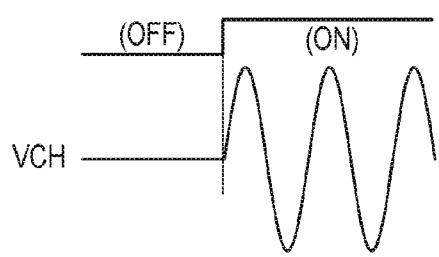

FIG. 5 shows an example of the detailed arrangement of the current-current converting circuit 109. The current-current converting circuit 109 can include a current mirror circuit CM1, PMOS transistors PM1, PM2, PM3, and PM4, and the switch SW1. The switch SW1 forms the gain changing switch 131. The current ICH is supplied from the voltage-current converting circuit 108 to the current mirror circuit CM1. The current mirror circuit CM1 outputs the mirror current of the current ICH to the PMOS transistor PM1. The output of the current mirror circuit CM1 is connected to the gate and the drain of the PMOS transistor PM1, the gate of the PMOS transistor PM2, and one terminal of the switch SW1. The gate of the PMOS transistor PM3 and the drain of the PMOS transistor PM4 are connected to the other terminal of the switch SW1, and the sources of the PMOS transistors PM1 to PM4 are connected to the power source Vcc. A gain control signal SW is supplied to the switch SW1 and the gate of the PMOS transistor PM4.

The PMOS transistors PM1 to PM3 form a current mirror circuit. When the level of the gain control signal SW is "H" (high level), the switch SW1 is turned on, and the current flowing in the PMOS transistor PM1 is mirrored by the PMOS transistors PM2 and PM3. Then, the sum of mirror currents flowing in the respective PMOS transistors PM2 and PM3 is supplied to the output circuit 110 as the drive current ILD. On the other hand, when the level of the gain control signal SW is "L" (low level), the switch SW1 is turned off, and the PMOS transistor PM4 is turned on. The gate voltage of the PMOS transistor PM3 changes to a Vcc voltage when the PMOS transistor PM4 is turned on. This turns off the PMOS transistor PM3. In this case, the current flowing in the PMOS transistor PM1 is mirrored only by the PMOS transistor PM2, and the mirror current flowing in the PMOS transistor PM2 is output as the current ILD to the output circuit 110.

As a result, the switch SW1 controlled by the gain control signal SW determines the number of transistors to be operated for the generation of the drive current ILD among the plurality of transistors (mirror circuits) that generate the mirror currents of the current ICH. Here, the number of transistors to be operated for the generation of the drive current ILD determines the magnitude of the drive current ILD. That is, by determining the number of transistors which are to be operated to generate the drive current ILD in accordance with the gain control signal SW, the gain of the voltage-current converting circuit 108 can be changed in accordance with the gain control signal SW. Here, since the gain of the current supply circuit 115 and, furthermore, the gain of the drive circuit 130 can be changed by changing the gain of the voltage-current converting circuit 108, the gain of the current supply circuit 115 and, furthermore, the gain of the drive circuit 130 can be changed by the gain control signal SW.

To increase the range of the light quantity of light emitted by the light emitting device 101 (that is, to increase the range of the current ILD), an operational amplifier having a wide dynamic range can be used as the operational amplifier 120 that forms the voltage-current converting circuit 108. However, if the voltage VCH supplied to the operational amplifier 120 becomes low, it reduces the responsiveness of the operational amplifier 120 and causes the delay quantity in the voltage-current converting circuit 108 to increase. As a result, in some cases, if the voltage VCH is decreased, an oscillation phenomenon can occur from a destabilized feedback loop due to the increased delay quantity of the entire feedback loop.

Hence, in the second embodiment, the gain of the current-current converting circuit 109 is changed in accordance with the gain control signal SW output from the control unit 105. The current ILD is provided by $$ILD = Gain \times VCH/R \qquad (1)$$

where R is a resistance value of the resistance 121 of the voltage-current converting circuit 108, and Gain is a gain of the current-current converting circuit 109. As is evident from equation (1), by reducing the Gain, the current ILD can be reduced without reducing the voltage VCH. Therefore, the stability of the feedback loop can be improved while increasing the light quantity range of light emitted by the light emitting device 101.

The input/output characteristics of the voltage-current converting circuit 108 are exemplified in FIGS. 6A and 6B. The solid line indicates the input to the voltage-current converting circuit 108, and the dotted line indicates the output from the voltage-current converting circuit 108. FIG. 6A shows the input/output characteristics when a large light quantity is set (when the target value TA is larger than a reference value), and FIG. 6B shows the input/output characteristics when a small light quantity is set (when the target value TA is smaller than the reference value). When a large light quantity is set, the control unit 105 sets the level of the gain control signal SW to "H", and when a small light quantity is set, the control unit 105 sets the level of the gain control signal SW to "L". As a result, the gain Gain of voltage-current converting circuit 108 when a small light quantity is set becomes smaller than the gain Gain of the voltage-current converting circuit 108 when a large light quantity is set. As exemplified in FIGS. 6A and 6B, by changing the gain of the current supply circuit 115 so that the gain of the drive circuit 130 is changed in accordance with the target value TA, it can reduce the delay of the voltage-current converting circuit 108 caused by a decrease in the target value TA of the light quantity.

The input/output characteristics of the voltage-current converting circuit 108 when the level of the gain control signal SW is fixed to "H" are shown in FIGS. 6C and 6D as comparative examples. The solid line indicates the input to the voltage-current converting circuit 108, and the dotted line indicates the output from the voltage-current converting circuit 108. FIG. 6C shows the input/output characteristics when a large light quantity is set (when the target value TA is larger than the reference value), and FIG. 6D shows the input/output characteristics when a small light quantity is set (when the target value TA is smaller than the reference value). As exemplified in FIG. 6D, if the target value TA of the light quantity is small, the responsiveness of the voltage-current converting circuit 108 is decreased and the delay quantity is increased. This can cause the feedback loop to oscillate. FIGS. 7A to 7D exemplify the waveforms of the voltage VCH corresponding to FIGS. 6A to 6D, respectively. If a small light quantity is set in the voltage-current converting circuit 108 when the level of the gain control signal SW is fixed to "H", the voltage VCH oscillates, and the feedback loop oscillates.

As is evident from equation (1), even in an arrangement in which the resistance value R is changed in accordance with the gain control signal SW, it can obtain the same effect as that of an arrangement in which the gain of the current-current converting circuit 109 is changed. For example, it is possible to adopt an arrangement in which a resistance to be used can be selected in accordance with the gain control signal SW by arranging, side by side, two resistances having resistance values different from each other to serve as the resistance 121. Here, the operation to change the gain of the current-current converting circuit 109 and the operation to change the resistance value of the resistance 121 of the voltage-current converting circuit 108 are both operations to change the gain of the current supply circuit 115.

The second embodiment has exemplified the driving of an anode-drive type light emitting device. However, a cathode-drive type light emitting device may also be adopted. This applies to the following embodiments in the same manner.

Figure 8:
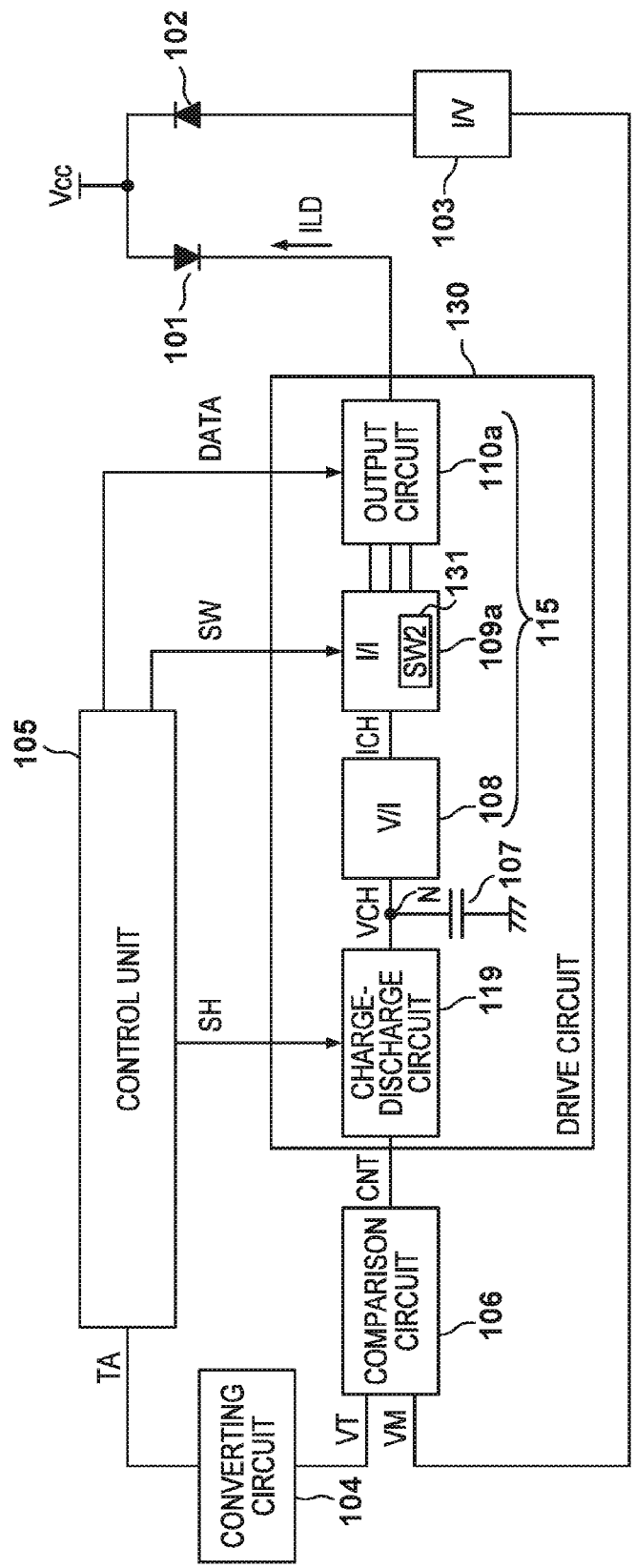
FIG. 8 is a block diagram showing the arrangement of a drive apparatus according to the third embodiment of the present invention.

FIG. 8 shows the arrangement of a drive apparatus 1 according to the third embodiment of the present invention. Matters not mentioned in the third embodiment can comply with the first and second embodiments. A drive circuit 130 of the third embodiment includes a charge-discharge circuit 119 that performs charging/discharging of a node N connected to the capacitance 107 and a current supply circuit 115 that supplies, to a light emitting device 101, a current ILD corresponding to a voltage VCH of the node N. The current supply circuit 115 can include a voltage-current converting circuit 108, a current-current converting circuit 109a, and an output circuit 110a. The voltage-current converting circuit 108 converts the voltage VCH of the node N to a current ICH. The current-current converting circuit 109a amplifies the current ICH. The output circuit 110a controls the supply/non-supply of the current ILD to the light emitting device 101 in accordance with control data DATA. A gain changing switch 131 can include a switch SW2 for changing the gain of the current supply circuit 115 so that the gain (more specifically, the gain of a circuit formed by the current-current converting circuit 109a and the output circuit 110a) of the drive circuit 130 is changed in accordance with a target value TA.

Figure 9:
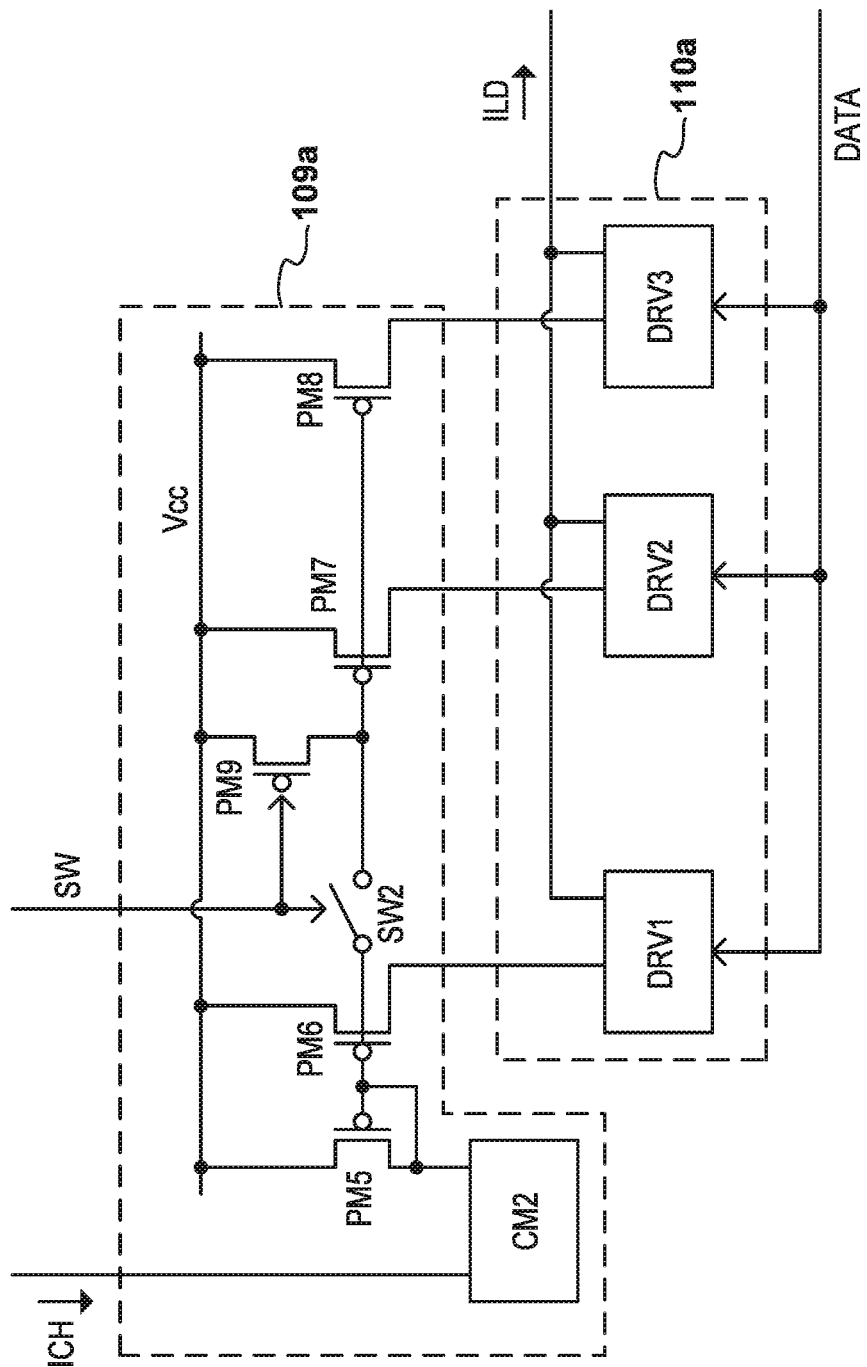
FIG. 9 is a circuit diagram showing an example of the arrangement of a current-current converting circuit and an output circuit according to the third embodiment.

FIG. 9 shows an example of the arrangement of the current-current converting circuit 109a and the output circuit 110a according to the third embodiment. The current-current converting circuit 109a can include a current mirror circuit CM2, PMOS transistors PM5 to PM9, and the switch SW2. The current ICH is supplied from the voltage-current converting circuit 108 to the current mirror circuit CM2. The current mirror circuit CM2 outputs a mirror current of the current ICH to the PMOS transistor PM5. The output of the current mirror circuit CM2 is connected to the gate and the drain of the PMOS transistor PM5, the gate of the PMOS transistor PM6, and one terminal of the switch SW2. The gates of the PMOS transistors PM7 and PM8 and the drain of the PMOS transistor PM9 are connected to the other terminal of the switch SW2. The sources of the PMOS transistors PM5 to PM9 are connected to a power source Vcc. A gain control signal SW is supplied to the switch SW2 and the gate of the PMOS transistor PM9.

When the level of the gain control signal SW is "H", the switch SW2 is turned on, and the current flowing in the PMOS transistor PM5 is mirrored by the PMOS transistors PM6 to PM8. Then, the mirror current flowing in each of the PMOS transistors PM6 to PM8 is supplied to the output circuit 110a. On the other hand, when the level of the gain control signal SW is "L", the switch SW2 is turned off, and the PMOS transistor PM9 is turned on. When the PMOS transistor PM9 is turned on, the gate voltage of each of the PMOS transistors PM7 and PM8 changes to a VCC voltage, and this turns off the PMOS transistors PM7 and PM8. In this case, the current flowing in the PMOS transistor PM5 is mirrored by only the PMOS transistor PM6, and the mirror current flowing in the PMOS transistor PM6 is supplied to the output circuit 110a.

The output circuit 110a includes drivers DRV1 to DRV3. The drain of the PMOS transistor PM6 is connected to the driver DRV1, the drain of the PMOS transistor PM7 is connected to the driver DRV2, and the drain of the PMOS transistor PM8 is connected to the driver DRV3. The outputs of the drivers DRV1 to DRV3 are connected to the output terminal of the current ILD. When the level of the gain control signal SW is "H", each of the drivers DRV1 to DRV3 outputs, in accordance with the control data DATA, a current having a value obtained by multiplying a current output from a corresponding one of the PMOS transistors PM6 to PM8 by a predetermined magnification factor. Subsequently, the current ILD which is the sum of the currents output from the respective drivers DRV1 to DRV3 is supplied to the light emitting device 101. On the other hand, when the level of the gain control signal SW is "L", the PMOS transistors PM7 and PM8 are turned off, and the driver DRV1 outputs, in accordance with a DATA signal, a current having a value obtained by multiplying the current output from the PMOS transistor PM6 by a predetermined magnification factor. Subsequently, the current output from the driver DRV1 is supplied as the current ILD to the light emitting device 101. In order to minimize the changes in the waveform of the current ILD due to changes in the gain, it is preferable for each of the drivers DRV1 to DRV3 to have the same circuit arrangement.

In general, as exemplified in FIG. 9, a plurality of drivers are often provided to allow the output circuit 110a to rapidly control the current ILD over a wide range. This is because the gate capacity becomes large and leads to bad responsiveness if a large-size MOS transistor is used for a large current to flow. The combination of the current-current converting circuit 109a and the output circuit 110a is advantageous for the output circuit 110a to rapidly control the current ILD over a wide range.

Figure 10:
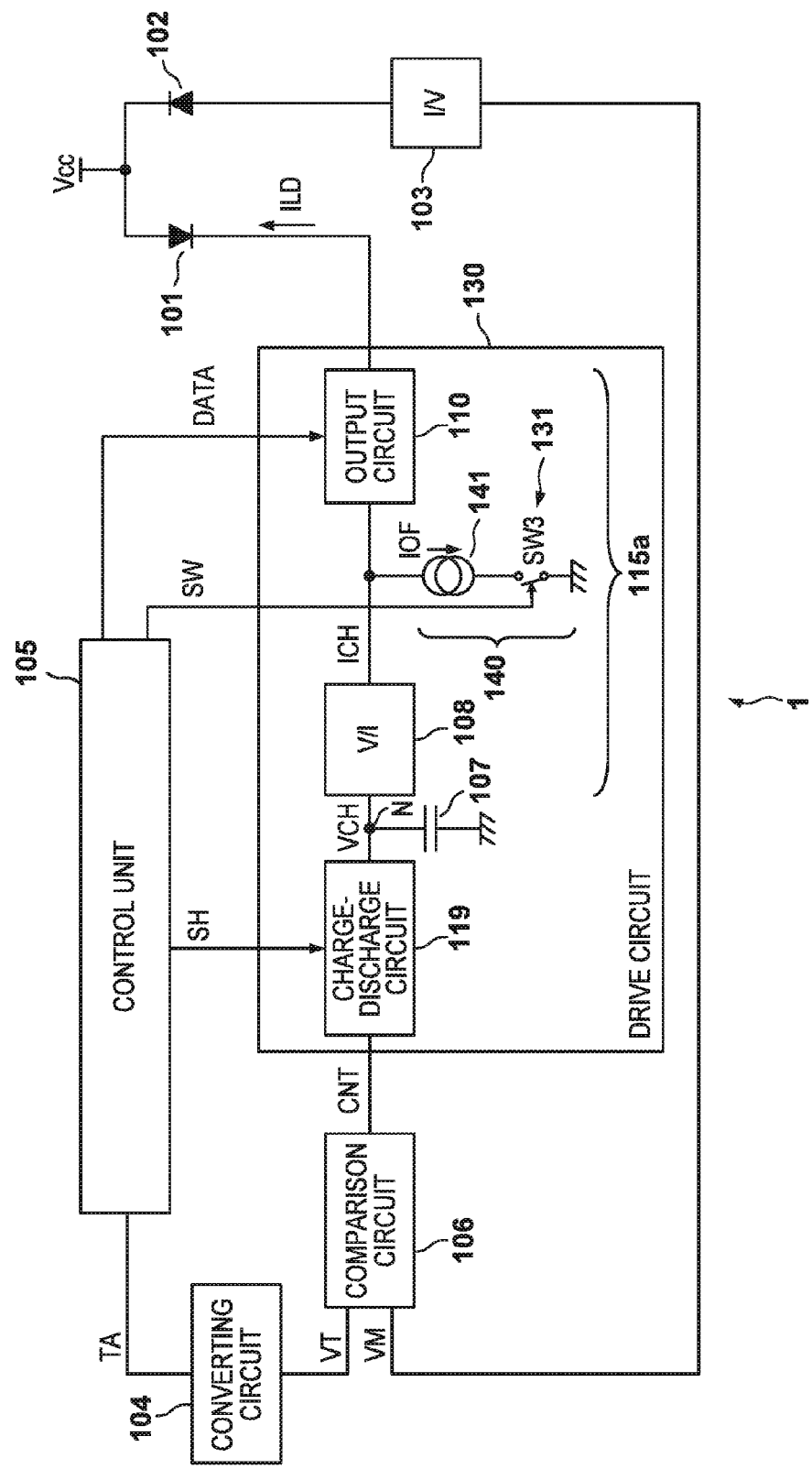
FIG. 10 is a block diagram showing the arrangement of a drive apparatus according to the fourth embodiment.

FIG. 10 shows the arrangement of a drive apparatus 1 according to the fourth embodiment of the present invention. Matters not mentioned in the fourth embodiment can comply with the first to third embodiments. A drive circuit 130 of the fourth embodiment includes a charge-discharge circuit 119 that performs, in accordance with a control signal CNT, charging/discharging of a node N connected to a capacitance 107 and a current supply circuit 115a that supplies a current ILD corresponding to a voltage VCH of the node N to a light emitting device 101. The current supply circuit 115a can include a voltage-current converting circuit 108, a shift circuit 140, and an output circuit 110. The voltage-current converting circuit 108 converts the voltage VCH of the node N to a current ICH. The shift circuit 140 shifts the magnitude of the current ICH so that a shift current obtained by shifting the magnitude of the current ICH generated by the voltage-current converting circuit 108 is supplied to the output circuit 110. The output circuit 110 controls the supply/non-supply of the current ILD to the light emitting device 101 in accordance with control data DATA. The shift circuit 140 includes a current source 141 arranged in a path between the output node of the voltage-current converting circuit 108 and a reference potential (for example, a ground potential). A gain changing switch 131 can include a switch SW3 series-connected to the current source 141 in the path between the output node of the voltage-current converting circuit 108 and the reference potential.

In the fourth embodiment, when a target value TA is smaller than a reference value, the level of a gain control signal SW is changed to "H", and when the target value TA is larger than the reference value, the level of the gain control signal SW is changed to "L". When the level of the gain control signal SW is "L", the switch SW3 is turned off for the inactivation of the shift circuit 140, and the current ICH generated by the voltage-current converting circuit 108 is directly supplied to the output circuit 110. In this case, the output circuit 110 supplies a current ILD, which has a value obtained by multiplying the current ICH by a predetermined magnification factor α, to the light emitting device 101 in accordance with the control data DATA. On the other hand, when the level of the gain control signal SW is "H", the switch SW3 is turned on for the activation of the shift circuit 140. As a result, a shift current ICH-IOF obtained by subtracting an offset current IOF from the current ICH generated by the voltage-current converting circuit 108 is supplied to the output circuit 110. In this case, the output circuit 110 supplies the current ILD, which has a value obtained by multiplying the shift current ICH-IOF by a predetermined magnification factor α, to the light emitting device 101 in accordance with the control data DATA. In this example, the shift current ICH-IOF is a current smaller than the current ICH.

Hence, when the target value TA is smaller than the reference value (when the level of the gain control signal SW is "H"), the current ILD is provided by $$\text{ILD}=(\text{ICH}-\text{IOF})\times\alpha=(\text{VCH}/R-\text{IOF})\times\alpha \qquad (2)$$

and when the target value TA is larger than the reference value (when the level of the gain control signal SW is "L"), the current ILD is provided by $$\text{ILD}=\text{ICH}\times\alpha=(\text{VCH}/R)\times\alpha \qquad (3)$$

The gain of current supply circuit 115a can be changed by the gain control signal SW in the fourth embodiment as well. More specifically, the gain of the current supply circuit 115a when the target value TA is smaller than the reference value can be made smaller than the gain of the current supply circuit 115a when the target value TA is larger than the reference value.

Figure 11:
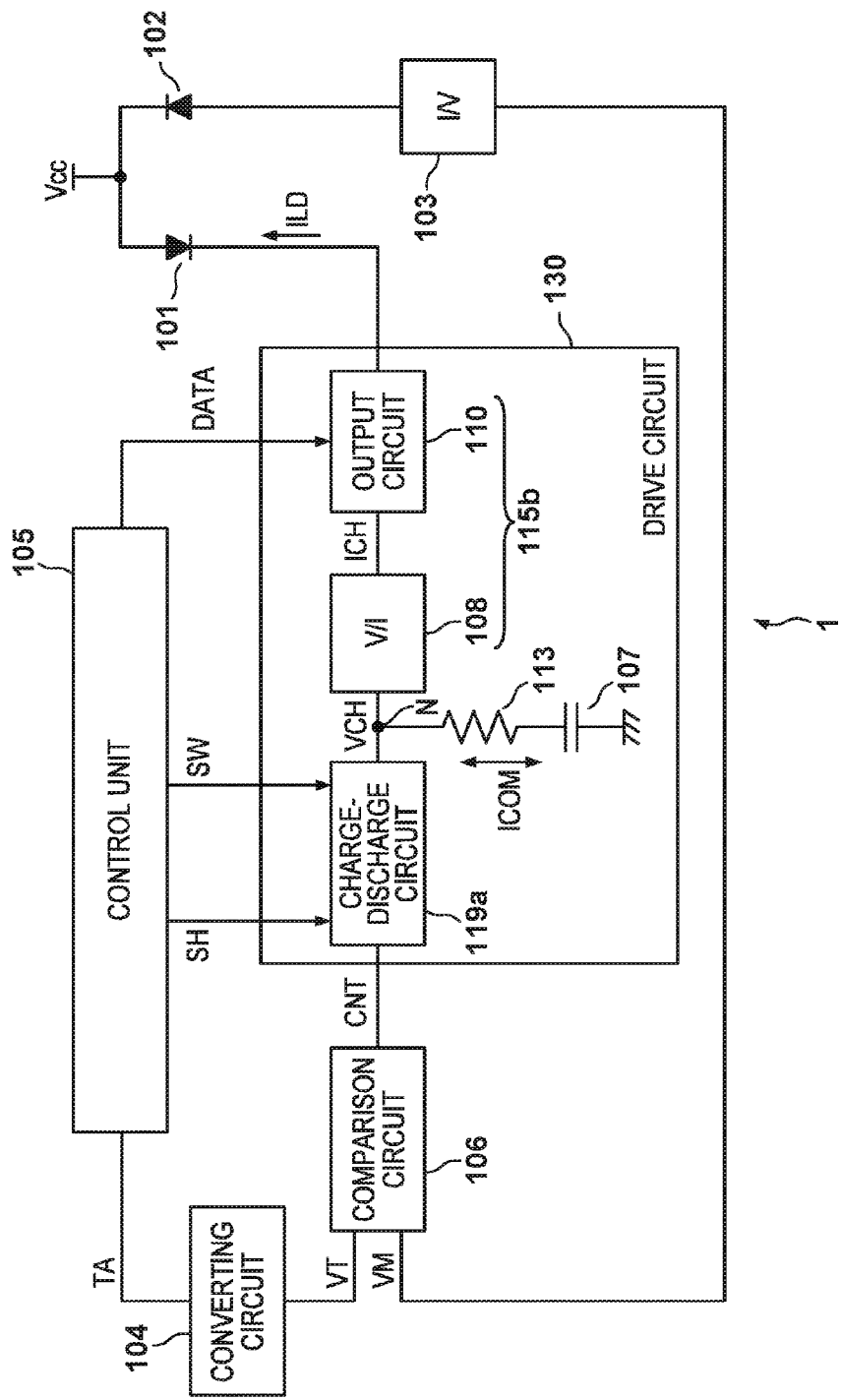
FIG. 11 is a block diagram showing the arrangement of a drive apparatus according to the fifth embodiment.

FIG. 11 shows the arrangement of a drive apparatus 1 according to the fifth embodiment of the present invention. Matters not mentioned in the fifth embodiment can comply with the first to fourth embodiments. In the fifth embodiment, a drive circuit 130 includes a charge-discharge circuit 119a that performs charging/discharging of a node N connected to a capacitance 107 and a current supply circuit 115b that supplies a current ILD corresponding to a voltage VCH of the node N to a light emitting device 101. The current supply circuit 115b can include a voltage-current converting circuit 108 and an output circuit 110. The voltage-current converting circuit 108 converts the voltage VCH of the node N to a current ICH. The output circuit 110 supplies the current ILD, which has a value obtained by multiplying the current ICH by a predetermined magnification factor α, to the light emitting device 101 in accordance with control data DATA.

Figure 12:
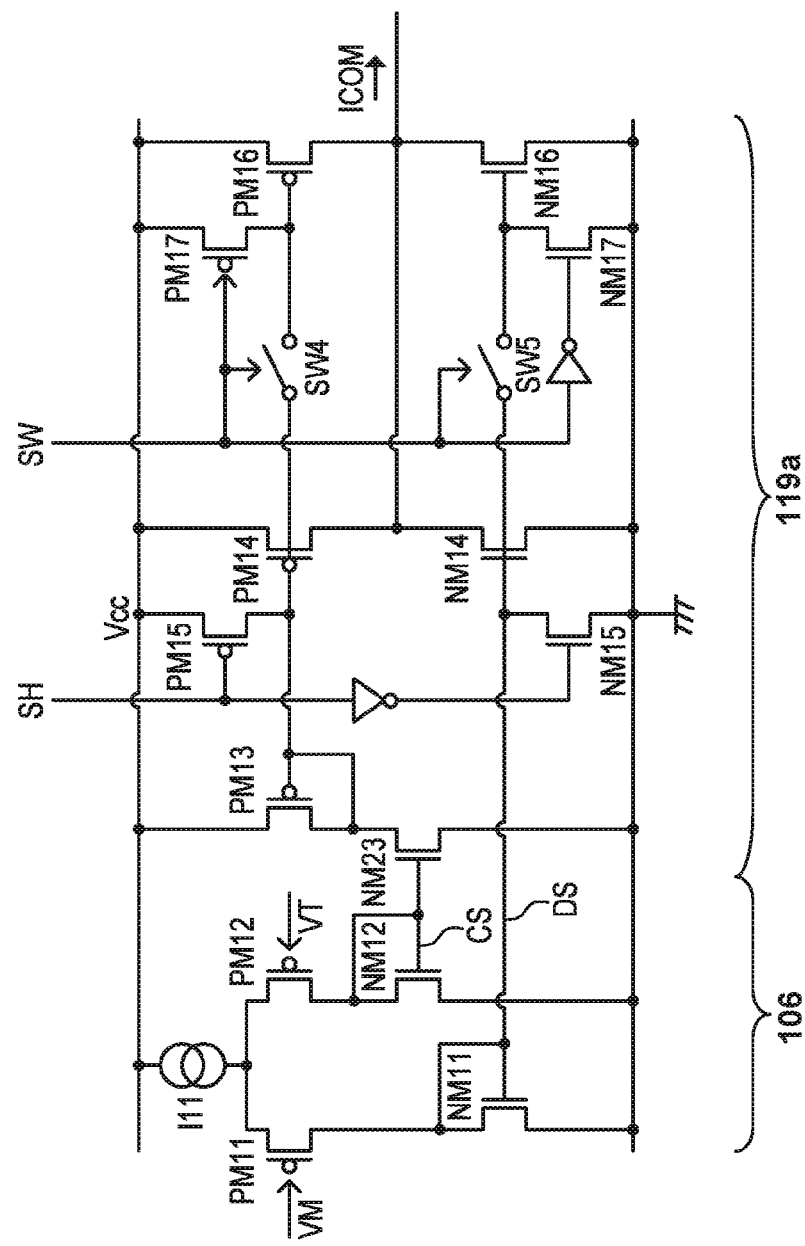
FIG. 12 is a circuit diagram showing an example of the arrangement of a comparison circuit and a charge-discharge circuit of the drive apparatus according to the fifth embodiment of the present invention.

FIG. 12 shows an example of the arrangement of a comparison circuit 106 and the charge-discharge circuit 119a. The comparison circuit 106 can include, in the same manner as that of the second embodiment, PMOS transistors PM11 and PM12 and NMOS transistors NM11 and NM12. The charge-discharge circuit 119a can include, as components in the same manner as those of the second embodiment, PMOS transistors PM13, PM14, and PM15 and the NMOS transistors NM13, NM14, and NM15. The charge-discharge circuit 119a can further include PMOS transistors PM16 and PM17 and the NMOS transistors NM16 and NM17. The charge-discharge circuit 119a includes, as a gain changing switch 131, switches SW4 and SW5 that change the magnitude (gain of the charge-discharge circuit 119a) of a current ICOM used by the charge-discharge circuit 119a to charge/discharge the capacitance 107.

One terminal of the switch SW4 is connected to the gate of the PMOS transistor PM14, and one terminal of the switch SW5 is connected to the gate of the NMOS transistor NM14. Additionally, the other terminal of the switch SW4 is connected to the gate of the PMOS transistor PM16 and the drain of the PMOS transistor PM17. The other terminal of the switch SW5 is connected to the gate of the NMOS transistor NM16 and the drain of the NMOS transistor NM17. The sources of the respective PMOS transistors PM13 to PM17 are connected to a power source Vcc, and the sources of the respective NMOS transistor NM11 to NM17 are connected to a ground potential. The drains of the PMOS transistors PM14 and PM16 are connected commonly to the drains of the NMOS transistors NM14 and NM16, respectively, and the current ICOM is output. A gain control signal SW is supplied to the gate of the PMOS transistor PM17 and the switches SW4 and SW5, and an inverted signal of the gain control signal SW is supplied to the gate of the NMOS transistor NM17.

As described in the second embodiment, when the level of a sample and hold signal SH is "H", a sample mode is set, and the current ICOM corresponding to the result of a comparison between a target voltage VT and a monitor voltage VM is output from the charge-discharge circuit 119a. Here, when the level of the gain control signal SW is "H", the switches SW4 and SW5 are turned on, the PMOS transistors PM14 and PM16 and the NMOS transistors NM14 and NM16 change to an operating state to output the current ICOM, and charging/discharging of the capacitance 107 is performed. On the other hand, when the level of the gain control signal SW is "L", the switches SW4 and SW5 are turned off, only the PMOS transistor PM14 and the NMOS transistor NM14 change to an operating state to output the current ICOM, and charging/discharging of the capacitance 107 is performed. That is, the gain of the charge-discharge circuit 119 in the sample mode is determined by the gain control signal SW. This can stabilize the feedback loop throughout the range of a target value TA. Here, although it is more preferable to set an arrangement in which the charge current and the discharge current are both adjustable as described above, it is possible to set an arrangement in which the current quantity of only one of the currents is adjustable. In this case, a feedback-loop stabilizing effect can be achieved.

When the level of the sample and hold signal SH is "L", the PMOS transistors PM14 and PM16 and the NMOS transistors NM14 and NM16 are turned off, the charge-discharge circuit 119a changes to a hold mode, and the charging/discharging operation stops. As a result, the voltage VCH of the capacitance 107 is held to a voltage value set immediately before the level of the sample and hold signal SH changes from "H" to "L".

In general, since the capacitance value of the capacitance 107 is large, the capacitance 107 can be arranged outside the IC in which the drive apparatus 1 is incorporated. Between the output terminal of the charge-discharge circuit 119a and the capacitance 107, an interconnection resistance inside the IC, a resistance on a mounting board, and a parasitic CH resistance 113 such as an equivalent series resistance ESR of the capacitance 107 are present, and the resulting influence cannot be ignored. That is, when the current ICOM is switched from charging to discharging or from discharging to charging during an APC operation, the stability of the feedback loop (APC loop) can be impaired by the occurrence of a voltage change in the voltage VCH. Since the stability of the feedback loop is reduced depending on the value of the parasitic CH resistance 113, a resistance having a resistance value that improves the stability of the feedback loop is inserted intentionally between the output terminal of the charge-discharge circuit 119a and the capacitance 107.

Figure 13A:
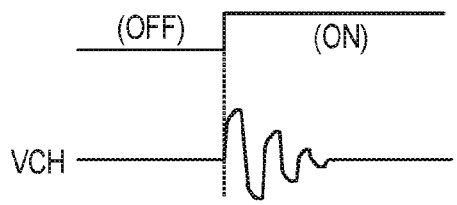
FIGS. 13A to 13D are views each exemplifying a waveform of a voltage VCH in the drive apparatus according to the fifth embodiment of the present invention.
Figure 13B:
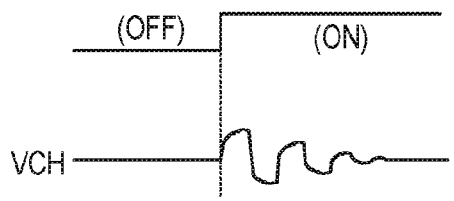
Figure 13C:
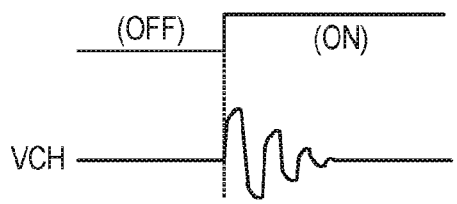
Figure 13D:
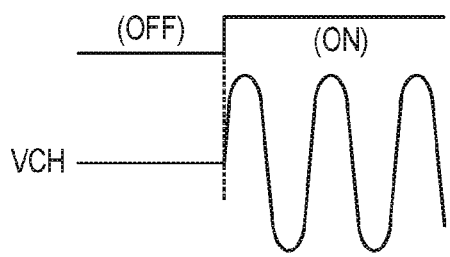

FIGS. 13A and 13B each exemplify a waveform of the voltage VCH in the drive apparatus 1 of the fifth embodiment. FIG. 13A shows the waveform of the voltage VCH when a large light quantity is set (when the target value TA is larger than a reference value), and FIG. 13B shows the waveform of the voltage VCH when a small light quantity is set (when the target value TA is smaller than the reference value). As exemplified in FIGS. 13A and 13B, the gain of the charge-discharge circuit 119a can be adjusted in accordance with the target value TA to stabilize the voltage VCH so that the feedback loop can be stabilized. FIGS. 13C and 13D each exemplify, as a comparative example, a waveform of the voltage VCH when the level of the gain control signal SW is fixed to "H". If a small light quantity is set when the level of the gain control signal SW is fixed to "H", the feedback loop oscillates due to the oscillation of the voltage VCH.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-104553, filed May 25, 2016, which is hereby incorporated by reference herein in its entirety.

What is claimed is:

1. A drive apparatus comprising:
a light emitting device;
a light receiving device configured to receive light emitted by the light emitting device;
a comparison circuit configured to compare a light quantity of light detected by the light receiving device with a target value indicating a light quantity of light to be emitted by the light emitting device and generate a control signal corresponding to a comparison result; and
a drive circuit configured to receive the control signal and to output, to the light emitting device, a drive signal having a value determined by a value of the control signal and a gain of the drive circuit,
wherein the drive circuit includes a gain changing switch configured to change, in accordance with the target value, the gain of the drive circuit, the gain of the drive circuit being defined as a ratio of the value of the drive signal to the value of the control signal.

2. The apparatus according to claim 1, further comprising:
a control unit configured to generate the target value and a gain control signal for controlling the gain changing switch so that the gain is changed in accordance with the target value.

3. A drive apparatus comprising:
a light emitting device;
a light receiving device configured to receive light emitted by the light emitting device;
a comparison circuit configured to compare a light quantity of light detected by the light receiving device with a target value indicating a light quantity of light to be emitted by the light emitting device and generate a control signal corresponding to a comparison result; and
a drive circuit configured to supply a drive signal corresponding to the control signal to the light emitting device,
wherein the drive circuit includes a gain changing switch configured to change, in accordance with the target value, a gain of the drive circuit, the gain of the drive circuit being defined such that the control signal is an input to the drive circuit and the drive signal is an output from the drive circuit,
wherein the drive circuit includes a charge-discharge circuit configured to perform charging/discharging of a node connected to a capacitance and a current supply circuit configured to supply a current corresponding to a voltage of the node to the light emitting device, and
wherein the gain changing switch includes a switch configured to change a gain of the current supply circuit so that the gain of the drive circuit is changed in accordance with the target value.

4. The apparatus according to claim 3, wherein the current supply circuit includes a voltage-current converting circuit configured to convert the voltage of the node into a current, and a current-current converting circuit configured to output a current corresponding to a current output from the voltage-current converting circuit, and
wherein the switch changes a gain of the current output from the current-current converting circuit with respect to the current output from the voltage-current converting circuit.

5. The apparatus according to claim 4, wherein the current-current converting circuit includes a first current mirror circuit configured to generate a first mirror current upon receiving the current output from the voltage-current converting circuit, and a second current mirror circuit configured to generate a second mirror current upon receiving the first mirror current, and
the switch determines, from among a plurality of transistors included in the second current mirror circuit, the number of transistors to be operated for generating the second mirror current.

6. The apparatus according to claim 5, wherein the switch connects the gates of the plurality of transistors to each other.

7. The apparatus according to claim 4, wherein the current supply circuit further includes an output circuit configured to control the supply and non-supply of the current output from the current-current converting circuit to the light emitting device, and
wherein the drive apparatus further comprises a control unit configured to control the state of the gain changing switch without changing the state of the output circuit.

8. The apparatus according to claim 4, wherein the current-current converting circuit includes a plurality of mirror circuits configured to generate mirror currents of the current output from the voltage-current converting circuit, and
wherein the switch determines, among the plurality of mirror circuits, the number of mirror circuits for generating the drive signal.

9. The apparatus according to claim 3, wherein a gain of the current supply circuit when the target value is smaller than a reference value is smaller than a gain of the current supply circuit when the target value is larger than the reference value.

10. The apparatus according to claim 3, wherein the charge-discharge circuit performs charging/discharging of the capacitance in a sample mode and does not perform charging/discharging of the capacitance in a hold mode.

11. A drive apparatus comprising:
a light emitting device;
a light receiving device configured to receive light emitted by the light emitting device;
a comparison circuit configured to compare a light quantity of light detected by the light receiving device with a target value indicating a light quantity of light to be emitted by the light emitting device and generate a control signal corresponding to a comparison result; and a drive circuit configured to supply a drive signal corresponding to the control signal to the light emitting device, wherein the drive circuit includes a gain changing switch configured to change, in accordance with the target value, a gain of the drive circuit, the gain of the drive circuit being defined such that the control signal is an input to the drive circuit and the drive signal is an output from the drive circuit, wherein the drive circuit includes a charge-discharge circuit configured to perform, in accordance with the control signal, charging/discharging of a node connected to a capacitance, a voltage-current converting circuit configured to generate a current corresponding to a voltage of the node, and a shift circuit configured to generate a shift current obtained by causing the magnitude of a current generated by the voltage-current converting circuit to shift, and the gain changing switch includes a switch configured to control the activation and inactivation of the shift circuit, and wherein, when the shift circuit is in activation, a drive current corresponding to a shift current generated by the shift circuit by shifting the magnitude of the current generated by the voltage-current converting circuit is supplied to the light emitting device, and when the shift circuit is in inactivation, a drive current corresponding to the current generated by the voltage-current converting circuit is supplied to the light-emitting device.

12. The apparatus according to claim 11, wherein the shift current is smaller than the current generated by the voltage-current converting circuit.

13. The apparatus according to claim 11, wherein the shift circuit is activated when the target value is smaller than a reference value, and the shift circuit is inactivated when the target value is larger than the reference value.

14. The apparatus according to claim 11, wherein the shift circuit includes a current source arranged on a path between an output node of the voltage-current converting circuit and a reference potential, and a switch is provided on the path.

15. A drive apparatus comprising:
a light emitting device;
a light receiving device configured to receive light emitted by the light emitting device;
a comparison circuit configured to compare a light quantity of light detected by the light receiving device with a target value indicating a light quantity of light to be emitted by the light emitting device and generate a control signal corresponding to a comparison result; and a drive circuit configured to supply a drive signal corresponding to the control signal to the light emitting device, wherein the drive circuit includes a gain changing switch configured to change, in accordance with the target value, a gain of the drive circuit, the gain of the drive circuit being defined such that the control signal is an input to the drive circuit and the drive signal is an output from the drive circuit, wherein the drive circuit includes a charge-discharge circuit configured to perform charging/discharging of a node connected to a capacitance in accordance with the control signal, and a current supply circuit configured to supply a current corresponding to a voltage of the node to the light emitting device, and wherein the gain changing switch includes a switch configured to change the magnitude of a current for the charge-discharge circuit to charge/discharge the capacitance so that the gain is changed in accordance with the target value.

16. A drive apparatus comprising:
a light emitting device;
a light receiving device configured to receive light emitted by the light emitting device;
a comparison circuit configured to compare a target value indicating a light quantity of light to be emitted by the light emitting device and a light quantity of light detected by the light receiving device and generate a control signal corresponding to a comparison result;
a charge-discharge circuit configured to perform, in accordance with the control signal, charging/discharging of a node connected to a capacitance;
a voltage-current converting circuit configured to generate a current corresponding to a voltage of the node;
a current source arranged on a path between an output node of the voltage-current converting circuit and a reference potential; and
a switch arranged on the path.

* * * * *